(12) United States Patent
Zhang et al.

(10) Patent No.: US 7,627,356 B2
(45) Date of Patent: Dec. 1, 2009

(54) MULTIFILAMENT AC TOLERANT CONDUCTOR WITH STRIATED STABILIZER AND DEVICES INCORPORATING THE SAME

(75) Inventors: Xun Zhang, Schenectady, NY (US); Venkat Selvamanickam, Wynantskill, NY (US)

(73) Assignee: SuperPower, Inc., Schenectady, NY (US)

( * ) Notice: Subject to any disclaimer, the term of this patent is extended or adjusted under 35 U.S.C. 154(b) by 191 days.

(21) Appl. No.: 11/487,204

(22) Filed: Jul. 14, 2006

(65) Prior Publication Data

US 2009/0131262 A1    May 21, 2009

(51) Int. Cl.
*H01B 12/10* (2006.01)
*H01F 6/00* (2006.01)
*H01L 39/00* (2006.01)
*H01L 39/24* (2006.01)

(52) U.S. Cl. ............... 505/231; 505/431; 505/410; 505/413; 505/236; 505/237; 505/238; 335/216; 335/229; 335/230; 428/469; 428/697; 428/933; 29/599; 174/125.1; 148/421; 148/426; 427/62

(58) Field of Classification Search ............ 505/230, 505/231, 236, 238, 703, 731; 174/125.1; 29/599; 148/421, 426; 427/62; 428/472.1, 428/469, 697, 933
See application file for complete search history.

(56) References Cited

U.S. PATENT DOCUMENTS

| | | | | |
|---|---|---|---|---|
| 5,352,656 | A * | 10/1994 | Lackey et al. | 505/434 |
| 5,952,269 | A | 9/1999 | Ma et al. | 505/325 |
| 6,309,767 | B1 | 10/2001 | Nies | |
| 6,428,635 | B1 * | 8/2002 | Fritzemeier et al. | 148/435 |
| 6,552,415 | B1 | 4/2003 | Paul et al. | |
| 6,716,545 | B1 | 4/2004 | Holesinger et al. | 428/701 |
| 6,828,507 | B1 | 12/2004 | Fritzemeier | |
| 6,849,580 | B2 | 2/2005 | Norton et al. | 505/237 |
| 6,906,008 | B2 | 6/2005 | Selvamanickam et al. | 505/434 |
| 6,908,362 | B2 | 6/2005 | Selvamanickam et al. | 451/28 |
| 6,933,065 | B2 | 8/2005 | Arendt et al. | 428/698 |
| 6,998,028 | B1 | 2/2006 | Selvamanickam | 204/192.11 |
| 7,025,826 | B2 | 4/2006 | Selvamanickam et al. | 117/3 |
| 7,109,151 | B2 * | 9/2006 | Lee et al. | 505/237 |
| 2002/0144838 | A1 * | 10/2002 | Fritzemeier et al. | 174/125.1 |
| 2004/0266628 | A1 * | 12/2004 | Lee et al. | 505/238 |
| 2005/0173679 | A1 * | 8/2005 | Mannhart et al. | 252/500 |
| 2005/0208204 | A1 | 9/2005 | Selvamanickam et al. | 427/62 |
| 2005/0220986 | A1 | 10/2005 | Selvamanickam et al. | 427/62 |
| 2006/0073975 | A1 * | 4/2006 | Thieme et al. | 505/125 |
| 2006/0079403 | A1 | 4/2006 | Lee et al. | 505/237 |

FOREIGN PATENT DOCUMENTS

WO    2007/034686    3/2007

OTHER PUBLICATIONS

*Critical State of Periodically Arranged Superconducting-Strip Lines in Perpendicular Field*,; Y. Mawatari,; Phys. Rev., B 54 13215 (1996).
*Mapping the Current Distribution in $YBa_2Cu_3O_{7-x}$ Think Films with Straitions*, G.A. Levin, P.N. Barnes, N. Amemiya, S. Kasai, K. Yoda, and Z. Jiang, Appl. Phys. Lett., vol. 86, 07259 (2005).
International Search Report for PCT/US2007/073478 dated Sep. 18, 2008.

* cited by examiner

*Primary Examiner*—Stanley Silverman
*Assistant Examiner*—Kallambella Vijayakumar
(74) *Attorney, Agent, or Firm*—Heslin Rothenberg Farley & Mesiti P.C.; Alana M. Fuierer, Esq.

(57) ABSTRACT

A multifilament high temperature superconductor with thick, striated stabilizer is disclosed, including a substrate, a buffer layer, a multifilament superconductor layer, and at least one thick stabilizer layer. Also disclosed are components incorporating superconducting tapes and methods for manufacturing same.

19 Claims, 6 Drawing Sheets

MULTIFILAMENT AC TOLERANT CONDUCTOR WITH STRIATED STABILIZER AND DEVICES INCORPORATING THE SAME

STATEMENT REGARDING FEDERALLY SPONSORED RESEARCH OR DEVELOPMENT

This invention is the result of a contract with the United States Air Force Research Laboratory, under contract no. FA865004-C-2476.

FIELD OF THE INVENTION

The present invention relates generally to high temperature superconductors (HTS), and more specifically a novel method for forming a multifilament AC tolerant superconductor with a thick, striated stabilizer, and articles manufactured using the method.

BACKGROUND

Energy costs and end-use consumption in the United States has risen dramatically over the past few years. Electricity, which accounts for almost half of the end-use energy consumption in the US, is highly dependent on the price of fossil fuels. With the rising demand and cost comes a requirement for more efficient and cost effective power and, in order to reduce dependence on fossil fuels, improvements in energy efficiency are needed.

Superconductor materials have been known and understood by the technical community for a long time. It was not until 1986, however, that the first oxide-based high-temperature (high-$T_c$) conductor with superconductive properties at a temperature above that of liquid nitrogen (77 K) was discovered, namely $YBa_2Cu_3O_7$ (YBCO). Since then, additional high-$T_c$ superconductor (HTS) materials, such as $Bi_2Sr_2Ca_2Cu_3O_{10+y}$ (BSCCO) and others, have also been developed.

The more recent development of HTS materials provides potential for the economically feasible manufacture of superconductor components. Perhaps most significantly is the development of such materials for use in the power industry, including applications for power generation, transmission, distribution, and storage.

In particular, more efficient electric power systems depend on more efficient wire technology. Thus, the development and use of HTS materials has led to the development of new wire technology. HTS wire can carry significantly more current than conventional copper and aluminum conductors of the same physical dimension, and it offers major size, weight, and efficiency benefits. HTS superconductors in the power industry include an increase in one to two orders of magnitude of power-handling capacity, significant reduction in the size (i.e., footprint) of electric power equipment, reduced environmental impact, greater safety, and increased capacity over conventional technology.

Accordingly, HTS technologies can drive down costs and increase the capacity and reliability of electric power systems. Developments in HTS wire will offer a powerful tool to improve the performance of power grids while reducing their environmental footprint.

However, many challenges exist with the commercialization of HTS superconductors. In particular, one obstacle has been the fabrication of a commercially feasible HTS tape that can be used to form the various power components. The "first generation" of HTS tapes included use of the above-mentioned BSCCO high-$T_c$ superconductor, typically embedded in a matrix of noble metal (e.g. Ag). Due to materials and manufacturing costs, however, such tapes do not represent a commercially feasible product for the extended lengths need.

More recently, "second generation" HTS tapes have been shown to have superior commercial viability. These tapes generally are comprised of a layered structure, typically including a flexible substrate that provides mechanical support; at least one buffer layer overlying the substrate; an HTS layer overlying the buffer film; and at least one stabilizer layer, typically formed of a nonnoble metal, overlying the HTS layer. Generally, more than one stabilizer layer is utilized and a capping layer, typically a noble metal layer, is deposited along the entirety of the HTS tape, including its side surfaces, in order to isolate the sensitive HTS layer from reacting with the non-noble stabilizer layer.

One such second-generation HTS tape utilizes YBCO coated conductor technology. The architecture of the coated conductor has not been optimized for AC applications, however, such as motors, generators, and transformers. In particular, the width and thickness of HTS tapes have a high dimension ratio, which in turn results in HTS coated conductors exhibiting very high hysteretic losses. Prior art discloses that magnetization losses can be reduced if the superconducting layer is divided into many parallel superconducting stripes segregated by nonsuperconducting resistive barriers. Therefore, in order to minimize AC hysteretic losses, it is desirable to subdivide the HTS layer of a tape into long thin linear filamentary stripes, or striations.

Although these multifilament conductors have been shown to greatly reduce hysteretic losses, numerous engineering and manufacturing challenges remain prior to full commercialization of striated second generation-tapes. A significant reduction of magnetization losses in coated conductors is a prerequisite for their use in AC power applications, such as transformers, generators, and motors. It is also important for any modifications to be compatible with current techniques of manufacturing the coated conductors, and it is essential to control the flux and current distributions in the HTS tape.

To date, a method does not exist for fabricating an HTS wire encapsulated with a thick stabilizer layer that also incorporates a striated HTS layer to reduce hysteric losses. As shown in FIG. 1A, conventionally, HTS tapes are fabricated by first depositing a flexible substrate (12). Next, at least one buffer layer (14) is deposited over the substrate, followed by an HTS layer (18), which overlies the buffer layer. A thin protective capping layer (13), typically formed of a noble metal such as Ag, is then deposited over the HTS layer. Finally, a stabilizer layer (19), typically formed of Cu or other non-noble metal, is deposited on the noble metal capping layer. The presence of a thicker, more robust stabilizer layer is beneficial because it provides overcurrent protection and quench stability, and it gives better protection to the HTS tape (rather than just a thin layer of Ag) in subsequent steps when the final non-conductive layer is applied.

At this point, conventional methods would call for photolithographic or other pattern transfer techniques to be used to transfer the desired filament pattern onto the stabilizer layer, followed by the use of wet etching or laser ablation techniques to form the desired striations in the stabilizer and HTS layer. As shown in FIGS. 1B-1C, this striation technique has been used to create multifilament HTS wire when only a thin capping layer is present. However, in order to provide adequate overcurrent current-handling capacity and quench stability, it is desirable to use both a thin, noble metal capping layer and thick, non-noble metal stabilizer layer, both of which completely encapsulate the HTS wire. In this way, the architecture of the HTS wire is better optimized for practical AC applications.

The thickness of the stabilizer layer, however, is generally within a range of about 1-1000 microns, and most typically within a range of about 10 to about 400 microns. Forming striations through the thick stabilizer layer using known chemical-etching techniques is prohibitively laborious, such that the fabrication of a multifilament HTS tape with a thick stabilizer layer has not yet been possible. In particular, etching through a thick stabilizer layer in addition to the thin capping layer, before reaching the HTS layer, results in much longer period of contact with a particular etching agent. A longer etching contact time causes an increase in the degradation of the HTS materials and a loss of superconducting properties due to an increased chemical reaction. Accordingly, it has not been feasible to use state of the art etching techniques in order to form multifilament HTS tapes with thick stabilizers.

SUMMARY OF THE INVENTION

According to a first aspect of the present invention, a multifilament AC tolerant superconductor with thick stabilizer is provided, comprising: a substrate having a first and second surface opposite each other; a buffer layer overlying the first opposite surface of the substrate; a multifilament superconductor layer overlying the buffer layer; and at least one stabilizer layer, wherein a portion of the at least one stabilizer layer is adjacent to the superconductor layer, is striated and has a thickness of at least 5.0 microns.

According to another aspect of the invention, a method for producing a multifilament AC tolerant superconductor with thick stabilizer is provided, comprising the steps of: providing a high temperature superconducting tape, comprising a substrate having first and second major surfaces, at least one buffer layer disposed on the first major surface of the substrate, and a superconducting layer disposed on the buffer layer; performing a pattern transfer step to form a multifilament pattern; depositing at least one stabilizer layer; removing the multifilament pattern to expose portions of the superconducting layer; and etching said exposed portions of the superconducting layer to create at least one groove that extends through the superconducting layer.

According to yet another aspect, a method for producing a multifilament AC tolerant superconductor with thick stabilizer is provided, comprising the steps of: providing a high temperature superconducting tape, characterized by a substrate having first and second major surfaces, at least one buffer layer disposed on the first major surface of the substrate, and a superconducting layer disposed on the buffer layer; depositing a first stabilizer layer on the superconducting layer; performing a pattern transfer step; depositing a second stabilizer layer; removing the residual pattern to expose the first stabilizer layer; and etching the exposed portions of first stabilizer layer and the superconducting layer to create at least one groove that extends through the superconducting layer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

This invention is directed to a method for forming striated, multifilament HTS coated conductors that are encapsulated with a thick stabilizer layer, and the resulting articles. The key step in the fabrication of a striated stabilizer for AC tolerant superconductor is to perform the pattern transfer step, such as photolithography or laser ablation, and then the stabilizer-plating step while the residual, undeveloped photoresist portions still remain on the surface of the HTS tape. After the stabilizer has been deposited, the residual photoresist portions are removed (also known as "lifted-off"), thereby exposing the surface of the underlying HTS tape to facilitate the final etching step and formation of a multifilament HTS tape.

Figure 2:
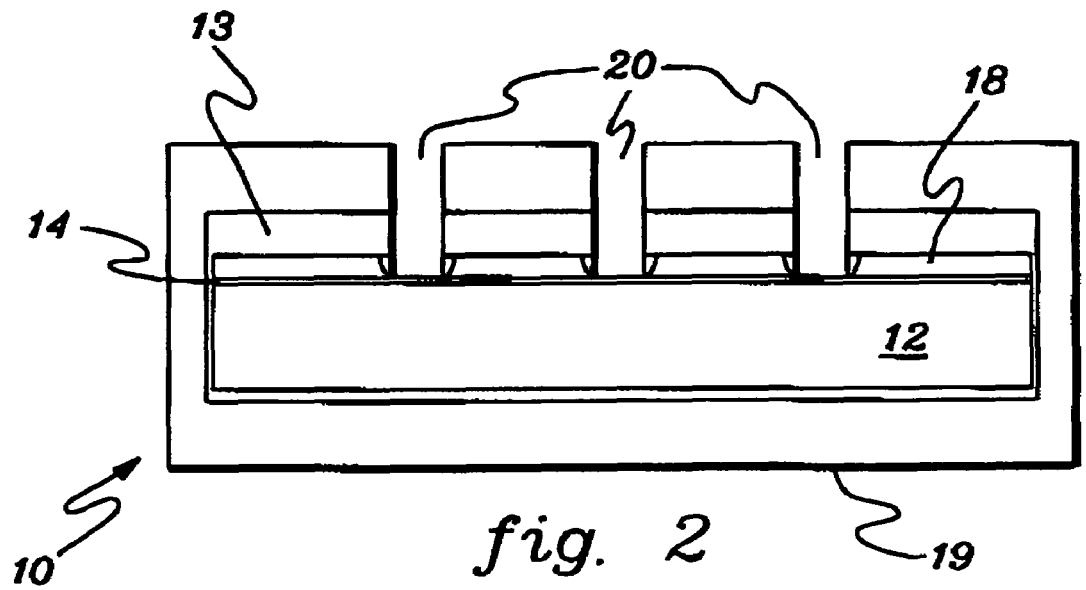
FIG. 2 illustrates a cross-sectional diagram of a novel multifilament AC tolerant conductor with a striated stabilizer, according to an embodiment of the present invention.

FIG. 2 is a cross-sectional diagram of an HTS conductor 10 according an embodiment of the present invention having a multi-layer composition. HTS conductor 10 is expected to be particularly useful for increasing current carrying capability and reducing AC resistive losses in HTS wires. HTS conductor 10 can provide a critical current density ($J_c$) of at least about 0.5 MA/cm$^2$ at about 77 K and self-field, and preferably at least about 1 MA/cm$^2$.

HTS conductor 10 includes generally a substrate 12, a buffer layer 14 overlying the substrate 12, an HTS layer 18, followed by a capping layer 13, typically a noble metal layer. According to a particular feature of the present invention, a stabilizer layer 19 is incorporated, to overlie the superconductor layer 18, and in particular, overlie and directly contact capping layer 13. Capping layer 13 and stabilizer layer 19 are generally implemented for electrical stabilization. More particularly, both capping layer 13 and stabilizer layer 19 aid in continued flow of electrical charges along HTS conductor 10 in cases where cooling fails or the critical current density is exceeded, and HTS layer 18 moves from the superconducting state and becomes resistive.

Figure 1A:
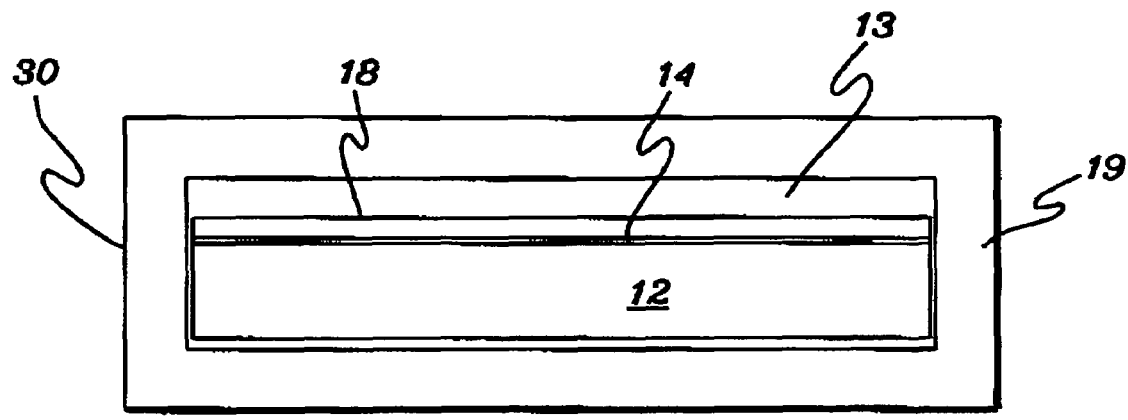
FIG. 1A illustrates a cross-sectional diagram of a coated conductor with a thick stabilizer, as known in the prior art.
Figure 1B:
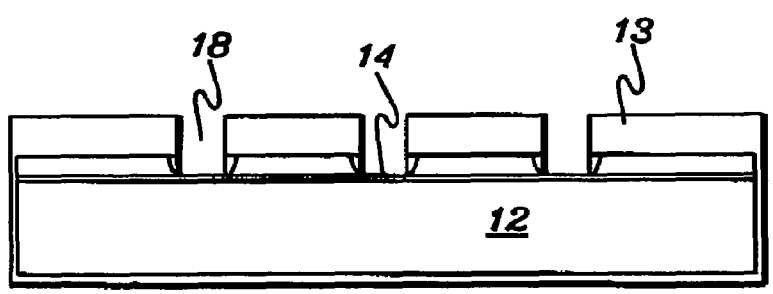
FIG. 1B to FIG. 1C are illustrative drawings showing the successive steps for fabricating a multifilament superconductor tape without a striated stabilizer, as known in the prior art.
Figure 1C:
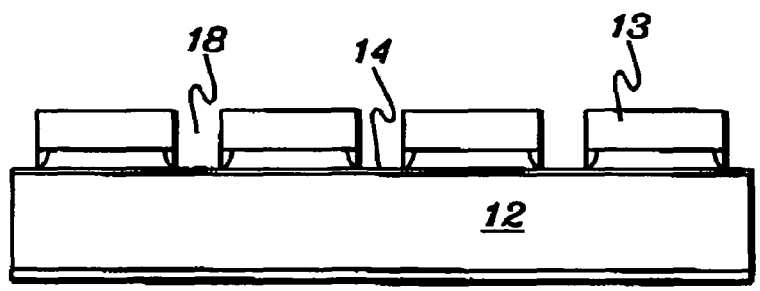

Additionally, by essentially doubling the cross-sectional area of the deposited stabilizer layer by encapsulating the superconductive tape, current-carrying capability is further improved. To the extent that a suitably electrically conductive material is utilized for the substrate 12, further current-carrying capability can be provided by the encapsulation as illustrated in FIG. 1. That is, the side portions extending laterally and defining side surfaces of the tape may provide electrical connection to the substrate itself, which can add to the current carrying capability of the coated superconductive tape.

According to another aspect of the present invention, HTS conductor 10 further includes striations 20, such that HTS layer 18 is divided into multiple filaments.

FIGS. 3A to FIG. 3F are illustrative drawings showing the successive steps for fabricating a multifilament AC tolerant conductor with striated stabilizer according the present invention. In this Example, a compound oxide superconductor of YBaCuO is used as the oxide superconductor.

Figure 3A:
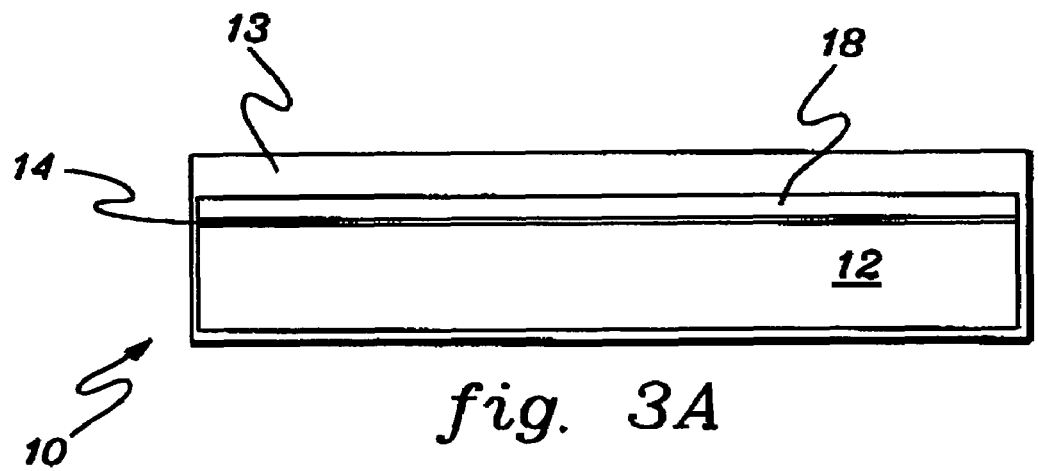
FIG. 3A to FIG. 3F are illustrative drawings showing successive steps for fabricating a novel multifilament AC tolerant conductor with a striated stabilizer, according to the present invention.

First, and as shown in FIG. 3A, HTS tape 11 is formed. HTS tape 11 includes substrate 12, capping layer 13, HTS layer 18, and buffer layer 14. Although this preliminary step is described in detail herein, it is not intended to be limiting, and it should be understood that any method of producing HTS tape 11 generally known in the art can be used. Further, the present invention is not limited to the particular embodiments of HTS tape 11 described herein.

Substrate 12 provides support for HTS conductor 10 and is generally a metal or polycrystalline ceramic. In the case of a metal, substrate 12 is typically an alloy of at least two metallic elements, such as a Ni-based metal alloy. The substrate material will vary according to the intended use of the superconducting article, and is not critical to the invention. Substrate 12 can be disposed using any suitable translation process, such as reel-to-reel translation. The thickness of the substrate will also vary according to the application.

Substrate 12 is typically in a tape-like configuration, having a high dimension ratio. As used herein, the term "dimension ratio" is used to denote the ratio of the longest dimension (length) of the article to the next longest dimension (width) of the article. The term "tape" or "tape-like" refers to an article having an dimension ratio not less than about $10^3$. Typically, the dimension ratio is greater than about $10^4$, and certain embodiments even having an dimension ratio of about $10^5$ and higher.

Substrate 12 can be treated so as to have desirable surface properties for subsequent deposition of the constituent layers of the HTS tape. For example, the surface may be lightly polished to a desired flatness and surface roughness. Additionally, the substrate may be treated to be biaxially textured. One process for forming a biaxially textured substrate is the process known in the art as RABiTS (roll assisted biaxially textured substrates), generally understood in the art.

Buffer layer 14 is disposed on substrate surface 12. Buffer layer 14 may be a single layer, or more commonly, be made up at least one additional film. Typically, the buffer layer includes a biaxially textured film suitable for subsequent formation of an HTS layer having desirable crystallographic orientation for superior superconducting properties. Such biaxial texturing may be accomplished by ion beam assisted deposition (IBAD), as is understood in the art, and as defined and described in U.S. Pat. No. 6,190,752, which is incorporated herein by reference. MgO is a typical material of choice for the IBAD film, and may be on the order or 50 to 500 Angstroms, such as 50 to 200 Angstroms. Although not specifically shown, buffer layer 14 may also include additional films to isolate substrate 12 from the epitaxial film or to reduce a mismatch in lattice constants between HTS lay 18 and the epitaxial film, as is understood in the art. If substrate 12 comprises a biaxially textured surface, buffer layer 14 is generally epitaxially grown on the textured substrate 12 so as to preserve biaxial texturing in buffer layer 14.

The process of this invention may be practiced with any known HTS material. Although not critical to the practice of the invention, HTS layer 18 generally has a thickness within a range of about 1 to about 30 microns, most typically about 2 to about 20 microns, and preferably about 2 to about 10 microns, in order to get desirable amperage ratings associated with the HTS layer 18. HTS layer 18 is typically chosen from any of the high-temperature superconducting materials that exhibit superconducting properties above the temperature of liquid nitrogen, 77 K, and preferably an oxide superconductor. One class of materials includes $REBa_2Cu_3O_{7-x}$ where RE is a rare earth element, such as Y, and related compounds. Such materials may also include, for example, $Bi_2Sr_2Ca_2Cu_3O_{10+y}$, $Ti_2Ba_2Ca_2Cu_3O_{10+y}$, and $HgBa_2Ca_2Cu_3O_{8+y}$. Of the foregoing, $YBa_2Cu_3O_{7-x}$, also generally referred to as YBCO, may be advantageously utilized.

There is no limit in principle to the manner of deposition of the HTS on the substrate and any of the known, commonly used techniques may be employed. Such methods include both thick and thin film forming techniques. Preferably, physical vapor deposition technique such as pulsed laser deposition (PLD) can be used for a high deposition rates, or a chemical vapor deposition technique can be used for lower cost and larger surface area treatment. Alternate methods include evaporation, including coevaporation, e-beam evaporation and activated reactive evaporation; sputtering, including magnetron sputtering, ion beam sputtering and ion assisted sputtering; cathodic arc deposition; organometallic chemical vapor deposition, plasma enhanced chemical vapor deposition, molecular beam epitaxy; a sol-gel process; liquid phase epitaxy and the like.

As is further illustrated in FIG. 3A, a first stabilizer layer, or capping layer, 13 may be deposited on HTS layer 18. Typically, a noble metal is utilized for capping layer 13 to prevent unwanted interaction between stabilizer layer 19 (shown in FIG. 2) and HTS layer 18. Typical noble metals include gold, silver, platinum, and palladium. Silver is more typically used due to its cost and general accessibility. Capping layer 13 is preferably thin for cost reasons, but thick enough to prevent unwanted diffusion of the components from stabilizer layer 19 into HTS layer 18. Typical thicknesses of capping layer 13 range within about 0.1 to about 10.0 microns, and more particularly about 1.5 to about 3.0 microns. Various techniques may be used for deposition of capping layer 13, including physical vapor deposition and magnetron sputtering method.

As further shown in FIGS. 2 and 3A, it is generally desirable to deposit capping layer 13 along the entirety of HTS tape 11, particularly along the side surfaces of the HTS tape, such that HTS tape is completely encapsulated by capping layer 13. This may be preferable in order to isolate HTS layer 18 from the side portions of stabilizer 19, which may be a non-noble metal such as copper or aluminum (as described below). Therefore, in accordance with this invention, capping layer 13 may overlie one of the two opposite major surfaces of the substrate, both major surfaces, or may completely encapsulate the substrate, buffer layer, and superconductor layer.

Figure 3B:
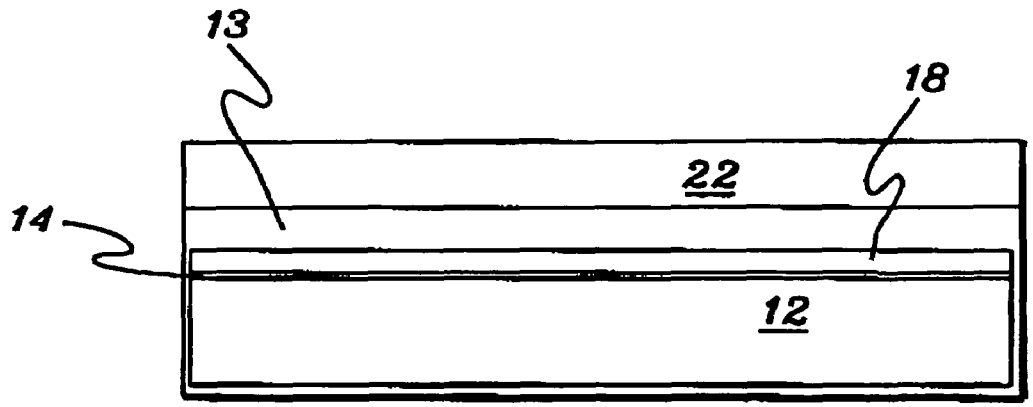
Figure 3C:
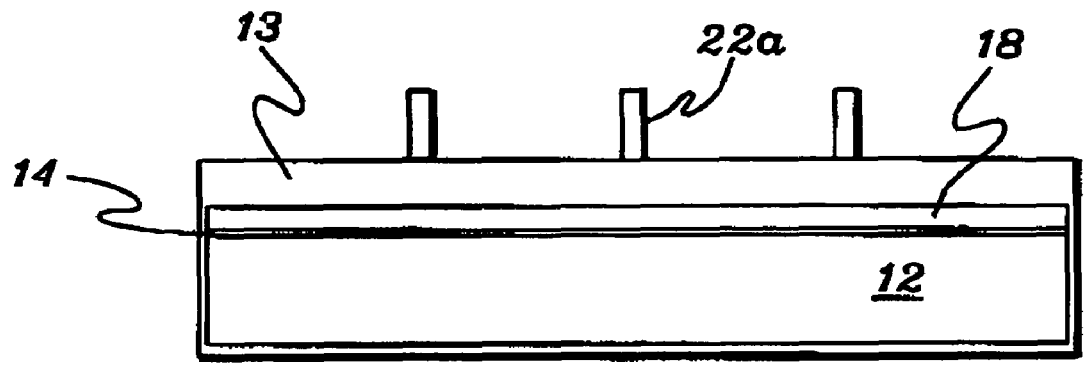

Next, as shown in FIGS. 3B-3C, a pattern transfer step is provided in the present invention. The actual processes of patterning HTS materials are well known in the art and thus will not be explained in great detail. Although the particular example disclosed herein makes reference to standard photolithographic techniques, there is no particular limitation on the process utilized to transfer the designed pattern to the surface of the capping layer 13 of HTS tape 11. In keeping with the present invention, the transfer step of FIG. 3B can be performed using other suitable, known techniques such as laser ablation, imprinting lithography, direct ink writing, screen printing and the like. In a preferred embodiment, photolithographic techniques are utilized. To the extent photolithography is employed, any suitable photosensitive polymeric material may be used. What is critical to the invention is that the pattern transfer step shown in FIGS. 3B-3C is performed prior to both the stabilizer-deposition step (FIG. 3D) and lift-off step (FIG. 3E).

As shown in FIG. 3B, a photoresist film is first applied to the major surface of HTS tape 11 that overlies HTS layer 18. The photoresist film can be deposited using any convenient coating technique such as spin coating, spray coating or hot-roller lamination to apply photoresist polymer, plastic thin film, or the like, thereby forming mask layer 22 on HTS tape 11. The mask layer that is coated must be compatible with the wet etching chemicals that will be used during the subsequent etching of capping layer 13 and HTS layer 18, described in detail herein. For example, as described in Example 1, if alkaline-based solution is to be used to etch silver capping layer, then photoresist polymer should not be used as a mask layer.

Turning to FIG. 3C, a suitable photomask is used such that the desired filament pattern is transferred to the surface of capping layer 13. More particularly, a suitable photomask is overlaid onto the photoresist to mask selected portions of capping layer 13 (and HTS layer 18) that are to be etched to form the desired multifilament HTS tape. The portions of photoresist layer 22 that are not masked are then developed and stripped. The portions of photoresist layer 22 that were masked, and thus not removed, form residual portions 22a on the surface of HTS tape 11. These residual photoresist portions 22a mask the areas where striations are desired in the underlying capping layer 13 and HTS layer 18, and subsequently will be formed using an etching process, as described herein.

As described more fully herein, and in accordance with the novel aspects of this invention, during the subsequent etching step, only the capping layer 13 and HTS layer 18 are etched—not the stabilizer layer 19. For this reason, the width of residual portions 22a can be wider than if the stabilizer layer were required to undergo etching in order to form the desired striations in the HTS layer 18. In particular, in a preferred embodiment, the width of residual portions 22a is generally within a range of 5-100 microns. The ability to create wider residual portions 22a enables one to use more preferable pattern transfer processes, such as dry film resist or plastic film. The wider spaces also allow for reliable wet etching techniques during subsequent steps, described herein.

Figure 3D:
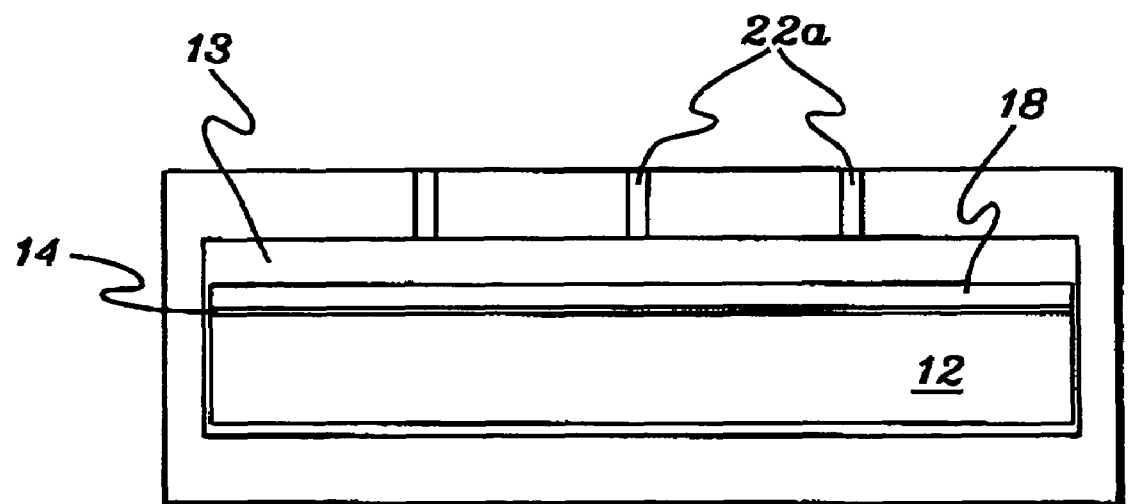
Figure 3E:
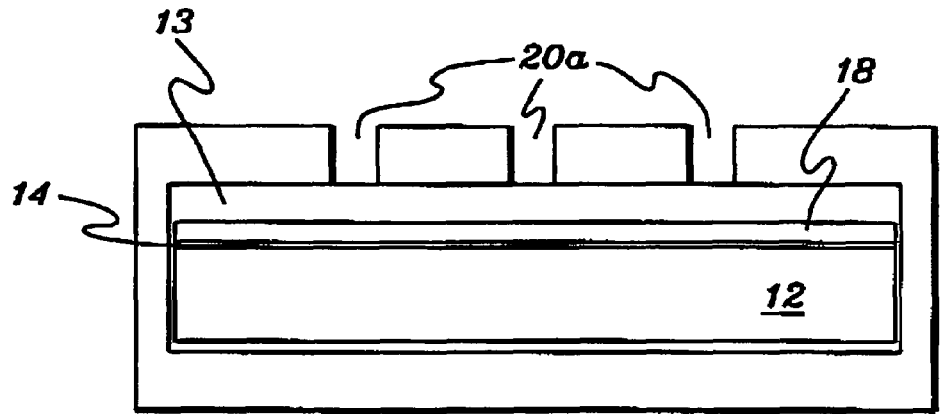

Next, secondary stabilizer layer 19 is deposited, as shown in FIG. 3D. In accordance with this invention, electrochemical deposition techniques, such as electroplating, are used to fully coat and encapsulate HTS tape 11 with a suitable, secondary stabilizer to form stabilizer layer 19 on the exposed areas of capping layer 13. The areas on capping layer 13 that are masked by residual photoresist portions 22a remain free from any secondary stabilizer material.

In order to provide adequate current-carrying capability in the secondary stabilizer layer, typically stabilizer layer 19 has a thickness within a range of about 1 to about 1,000 microns, most typically within a range of about 10 to about 400 microns, such as about 10 to about 200 microns. Particular embodiments had a nominal thickness within a range of about 20 microns to about 50 microns.

In the preferred embodiment illustrated in FIGS. 1-3, the entire superconductive tape is encapsulated with stabilizer layer 19, such that stabilizer layer 19 is disposed on opposite major surfaces of the superconductive tape, as well as the side surfaces of the superconductive tape. This particular structure further protects HTS layer 18, in the case of cryogenic failure, superconductivity quench, etc. The use of electroplating techniques allows for the complete encapsulation of HTS tape 11 with stabilizer layer 19 in one step. However, the invention described herein is not limited to applications that encapsulate HTS tape 11 with stabilizer, but can also be applied to applications wherein stabilizer layer 19 is disposed only on the one major surface that overlies HTS layer 18.

According to a particular feature of the embodiment, an electroplating technique defined and described in U.S. Pub. No. 2006/0079403 (Ser. No. 11/130,349), which is incorporated herein by reference, is used to form stabilizer layer 19. According to this technique, because the exposed areas of capping layer 13 are conductive, electroplating can be carried out at a high rate of deposition, typically at a rate of about 1 micron per minute or higher, to quickly build-up a thick stabilizer layer 19 on the superconducting tape. More particularly, capping layer 13 functions as a seed layer for deposition of copper, or other metal, thereon.

While the foregoing generally references copper, it is noted that other metals, including aluminum, silver, gold, and other thermally and electrically conductive metals may also be utilized as a secondary stabilizer to form stabilizer layer 19. However, it is generally desirable to utilize a non-noble metal to reduce overall materials cost for forming the superconductive tape.

Although the particular example disclosed herein makes reference to standard electroplating techniques, there is no particular limitation on electrochemical deposition methods utilized during the step shown in FIG. 3D. Alternate electrochemical deposition methods may be used to deposit stabilizer layer 19, such as electroless plating, metal spraying and vacuum metallization. In accordance with this invention, stabilizer layer 19 may overlie one of the two opposite major surfaces of the substrate, both major surfaces, or may completely encapsulate the substrate, buffer layer, and superconductor layer.

Referring to FIG. 3E, once stabilizer layer 19 has been deposited, the method disclosed herein provides for residual photoresist portions 22a to be removed using techniques known in the art. For example, residual photoresist portions can be washed off with a photoresist remover, such as acetic-acid based remover specifically formulated to remove acrylic-polymer based photoresist, or other suitable organic solvent. As shown in FIG. 3E, when residual photoresist portions 22a are removed, grooves 20a are formed, thereby exposing the underlying capping layer 13 in the areas where the striated pattern is desired.

Figure 3F:
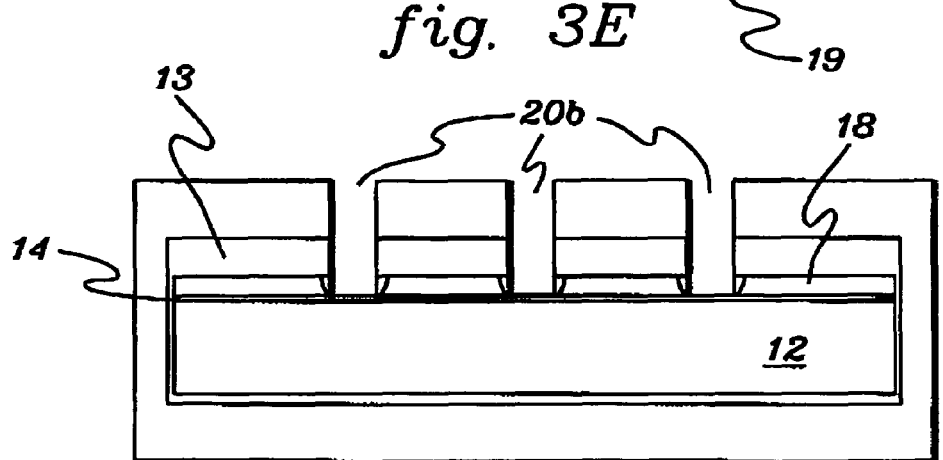

FIG. 3F illustrates the final step that results in a multifilament HTS conductor with a thick stabilizer layer. Chemical etching is one possible way to configure a desired design in the capping layer and superconducting layer.

In this step, portions of capping layer 13 are exposed through grooves 20a. The exposed portions of capping layer 13 are first removed using a chemical etching technique known in the art. For example, spray etching or dip etching with potassium iodide/iodine mixture can be used. As further shown in FIG. 3F, the exposed underlying HTS layer 18 is then removed using an etching technique known in the art, such as wet etching using phosphoric acid or citric acid, in such a manner that grooves 20b are formed. The multifilament HTS layer can also be produced by other etching techniques, such as laser ablation. In a preferred embodiment, pressure spray etching and/or deep trench cleaning are used, as described in Example 1 below, to minimize over-etching the HTS material.

The grooves, or striations, extend through the capping layer 13 and HTS layer 18 such that the desired multifilament pattern is created. Regardless of which technique is used, in a preferred embodiment, the etching process removes the unwanted portions of capping layer 13 and HTS layer 18 in a very short period of time (typically, 30 seconds for the capping layer and 60 seconds for the HTS layer.) to create grooves 20b.

In a preferred embodiment, the portion of grooves 20b that extend through stabilizer layer 19 and capping 13 have sidewalls that are substantially perpendicular and parallel to one another. This particular architecture is possible in accordance with the invention disclosed herein because grooves 20a are formed prior to stabilizer deposition and do not require any etching processes. Once grooves 20a are formed, less contact time is needed during the etching process to remove capping layer 13. Previous etching methods have a typical duration of about 40 to 60 minutes in contact with the etching agent, assuming a 20 microns thick stabilizer and capping layer. This long etching time causes a loss of superconducting properties due to the increase chemical reaction. However, with the formation of grooves 20a, the exposed capping layer and HTS layer will be removed at a much higher rate than if the stabilizer layer was in place. Thus, grooves 20b will be created in a much shorter time and the sidewalls will form substantially perpendicular and parallel to one another.

Figure 4:
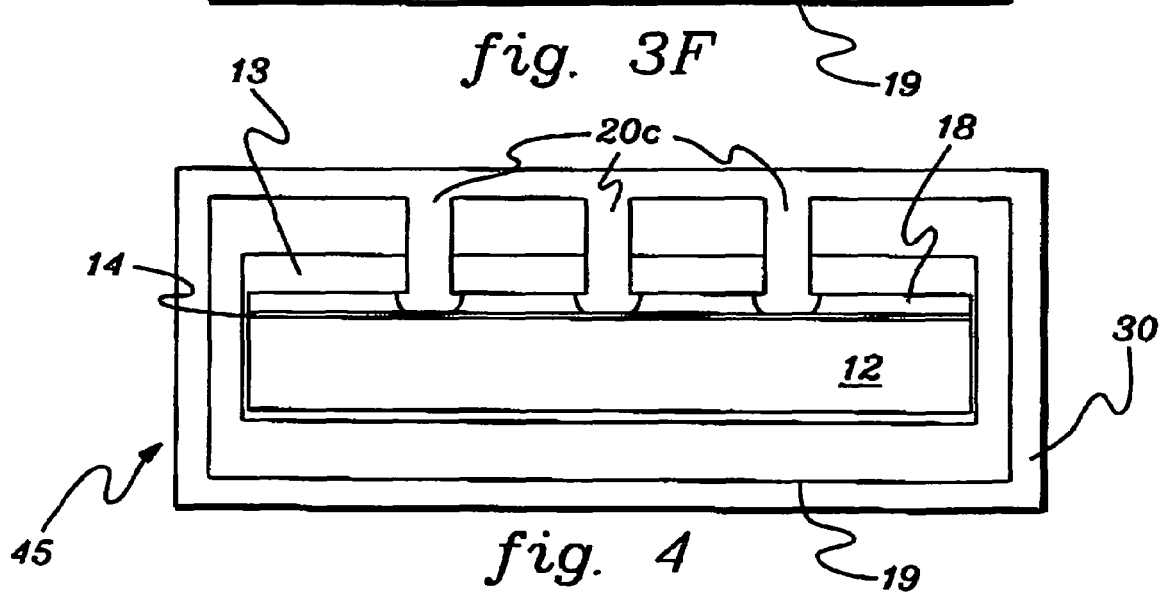
FIG. 4 illustrates a cross-section of a novel multifilament AC tolerant conductor with a striated thick stabilizer according to another embodiment of the present invention in which the entire superconductive tape is encapsulated by an insulating layer.

As shown in FIG. 4, according to another aspect of this invention, an insulator layer 30 can be deposited on multifilament conductor 10 before the latter is passed to the next stages for use as a desired superconducting device. The invention is useful for a wide variety of applications, particularly high temperature superconducting wires or tapes which can be used for transmission lines, motors, generators, or high-field magnetic operations.

Figure 5:
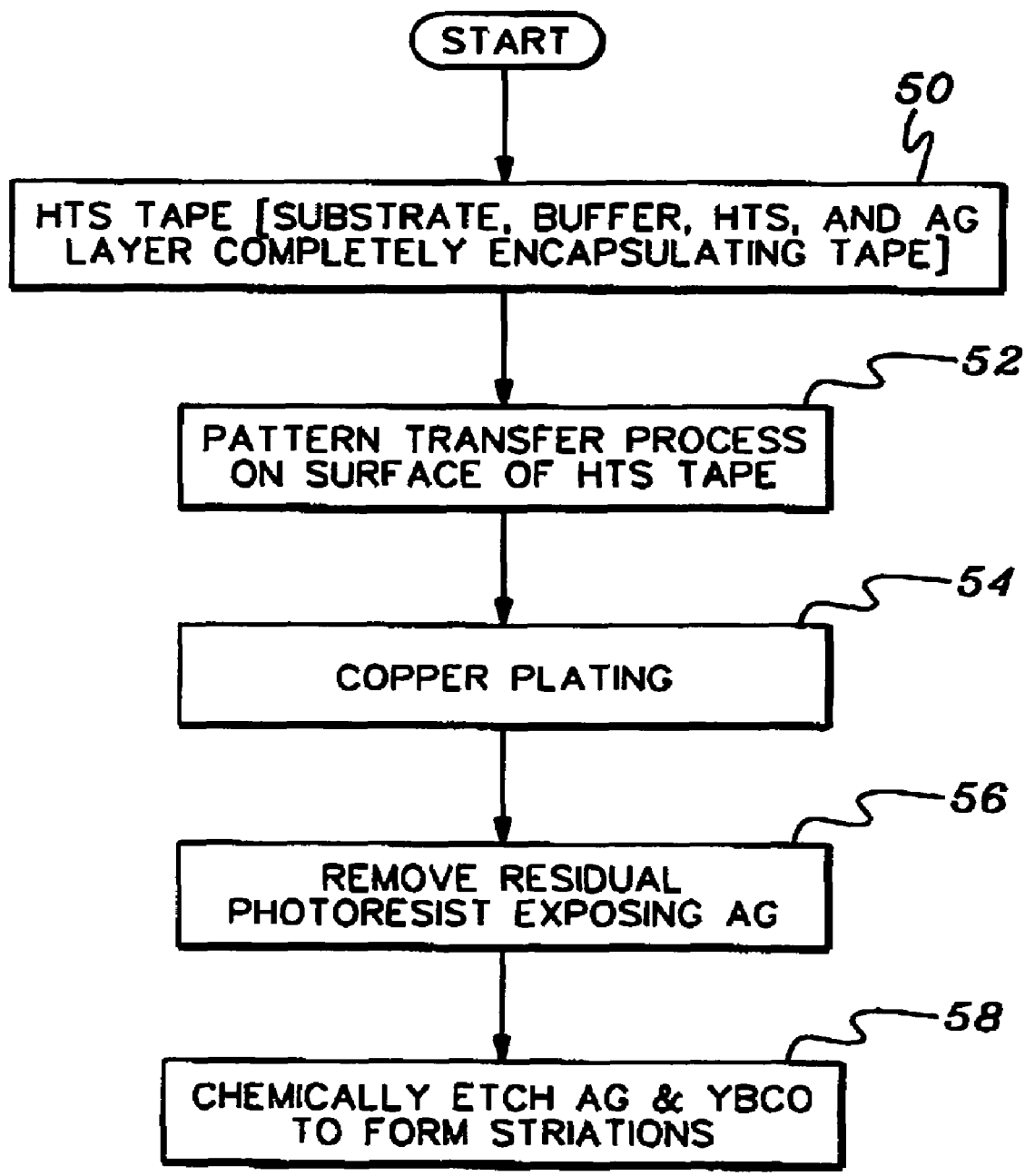
FIG. 5 illustrates a striating process according to an embodiment of the present invention.

A flow chart of the individual steps which comprise the novel striating process as described hereinabove are illustrated in FIG. 5, according to an embodiment of the present invention.

Although it is described in the particular embodiment above that the pattern transfer process is formed after depositing capping layer 13, one of ordinary skill in the art will readily appreciate that the above described steps may eliminate depositing capping layer 13 first, such that the photolithography or other pattern transfer process will be used to form photoresist portions directly on HTS layer 18 over the areas where striations are desired. The pattern transfer step would then be followed by deposition of at least one stabilizer layer. The lift-off steps and etching steps that follow would be the same as described above.

Figure 6A:
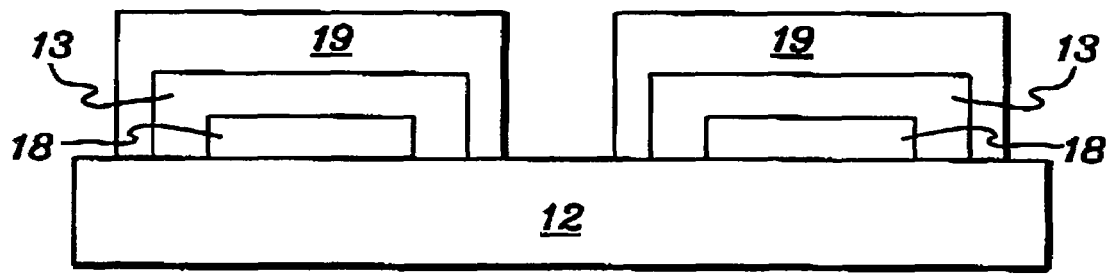
FIGS. 6A-6B illustrate yet another preferred embodiment according to the present invention wherein the superconducting filaments are encapsulated by at least one stabilizer.
Figure 6B:
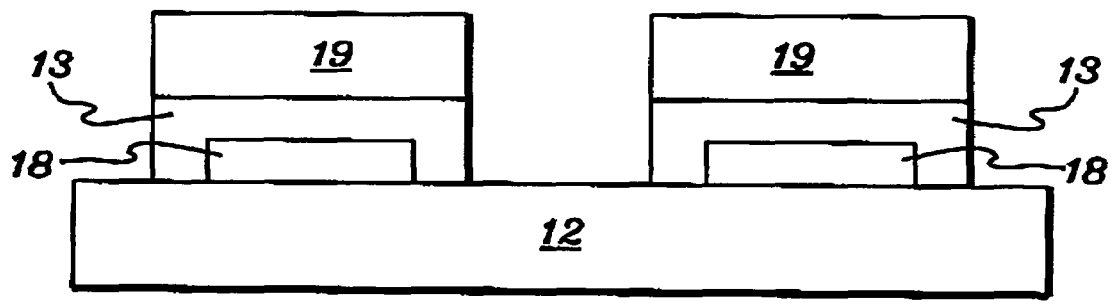

FIGS. 6A and 6B illustrate an alternative, preferred embodiment according to the present invention, wherein each of the individual HTS filaments are fully encapsulated by at least one stabilizer.

In yet another alternate embodiment, not shown, HTS conductor has a dual-sided structure, such that the buffer layer is deposited on both sides of substrate 12, and then the superconducting material is deposited on both sides both of the buffer layers. A capping layer is then deposited on both of the HTS layers in order to encapsulate the HTS material. Photolithography, or other pattern transfer process, is used to form residual photoresist portions over the areas where striations are desired, followed by deposition of a second stabilizer layer to encapsulate the superconducting article. The remaining lift-off steps and etching steps are the same as described above.

One of ordinary skill in the art will readily appreciate that HTS conductor 10 can be incorporated into commercial power components, such as a power cables, power transformers, power generators, and power grids. These additional embodiments are described in more particular detail in U.S. Pub. No. 2006/0079403 (Ser. No. 11/130,349), which is incorporated herein by reference.

While particular aspects of the present invention have been described herein with particularity, it is well understood that those of ordinary skill in the art may make modifications hereto yet still be within the scope of the present claims. The invention is in no way limited to the particular embodiments disclosed herein.

EXAMPLES

It should be understood that the examples and embodiments described herein are for illustrative purposes only and that various modifications or changes in light thereof will be suggest to persons skilled in the art and art to be included within the spirit and purview of this application. The invention can take other specific forms without departing from the spirit or essential attributes thereof.

The following samples were created utilizing the technique as described above.

Example 1

Samples were created utilizing the novel striation technique described above. In particular, samples were provided using 4 mm width of substrate with a thickness of 50 microns. In these particular samples, the substrate used was a nickel-based alloy (Hastelloy C276). A buffer layer stack comprising of alumina, yttria, MgO, and LaMnO3 were deposited to a total thickness of 160 nm. Next, MOCVD (Metalorganic Chemical Vapor Deposition) process was performed to form a one micron thick YBCO layer. Next, samples were then subjected to magnetron sputtering of silver to form 3-micron thick capping layers. Next, a layer of dry film photoresist was coated, such that a known photolithographic technique, i.e. broad band UV exposure and photoresist developing, could be used to transfer the desired striation pattern. Those samples were placed in a copper-sulfate solution and biased such that the capping layers formed a cathode, the anode being a copper plate. Electroplating was carried out to form a copper layer having a nominal thickness of about 20 microns. The copper layer functions as a thick stabilizer. The remaining photoresist was washed off with photoresist remover. Next, samples were subjected to silver etching in the potions not covered by copper. Spray etching or dip etching with potassium iodide/iodine solution can be used. After the silver etching, the exposed underlying HTS layer was then removed using an etchant such as 0.2 M citric acid, in such a manner to form grooves through thick copper stabilizer, silver layer and HTS layer. And finally, samples were coated with a nonconductive, insulating material.

Example 2

Samples were created utilizing the novel striation technique described above. In particular, samples were provided using 4 mm width of substrate with a thickness of 50 microns. In these particular samples, the substrate used was a nickel-based alloy (Hastelloy C276). A buffer layer stack comprising of alumina, yttria, MgO, and LaMnO3 were deposited to a total thickness of 160 nm. Next, MOCVD (Metalorganic Chemical Vapor Deposition) process was performed to form a one-micron thick YBCO layer. Next, samples were then subjected to magnetron sputtering of silver to form 3-micron thick capping layers. Next, a polyimide film was laminated, such that a known laser ablation technique, i.e. using 308 nm or 248 nm excimer laser, could be used to transfer the desired striation pattern in a single step. Those samples were placed in a copper-sulfate solution and biased such that the capping layers formed a cathode, the anode being a copper plate. Electroplating was carried out to form a copper layer having a nominal thickness of about 20 microns. The copper layer functions as a thick stabilizer. The un-ablated strips of the polyimide film were peeled off. Next, samples were subjected to silver etching in the portions not covered by copper. Spray etching or dip etching with alkaline-based solution (i.e., 20 vol. % $H_2O_2$+20 vol. % $NH_4OH$+60 vol. % DI water) can be used. After the silver etching, the exposed underlying HTS layer was then removed using an etchant such as 0.1 M phosphoric acid solution, in such a manner to form grooves through the thick copper stabilizer, silver layer and HTS layer. And finally, samples were coated with a nonconductive, insulating material.

Example 3

Samples were created utilizing the novel striation technique described above. In particular, samples were provided using 4 mm width of substrate with a thickness of 50 microns. In these particular samples, the substrate used was a nickel-based alloy (Hastelloy C276). A buffer layer stack comprising of alumina, yttria, MgO, and LaMnO3 were deposited to a total thickness of 160 nm. Next, MOCVD (Metalorganic Chemical Vapor Deposition) process was performed to form a one-micron thick YBCO layer. Next, a 30-micron thick layer of dry film photoresist was coated, such that a known photolithographic technique, i.e. broad band UV exposure and photoresist developing, could be used to transfer the desired striation pattern. Then, samples were subjected to physical vapor deposition process to coat a 1-micron thick capping layer such as copper. In this deposition process such as metal evaporation, temperature is controlled to be compatible with photoresist remaining on samples. Next, those samples were placed in a copper-sulfate solution and biased such that the capping layers formed a cathode, the anode being a copper plate. Electroplating was carried out to form a copper layer having a nominal thickness of about 20 microns. The copper layer functions as a thick stabilizer. Then, the remaining photoresist strips (30-micron thick) was etched off by photoresist remover. During this etching step, the first and second layers of copper are lifted off. In this way, a trench or groove was formed to expose YBCO in desired area, which could then be removed using an etchant such as 0.2 M citric acid. Finally, samples were coated with a nonconductive, insulating material in the groove to isolate HTS filaments.

It should be understood that the examples and embodiments described herein are for illustrative purposes only and that various modifications or changes in light thereof will be suggest to persons skilled in the art without departing from the scope of the present claims.

We claim:

1. A high temperature coated superconductor article, comprising:
    a substrate having first and second surfaces opposite each other;
    a buffer layer overlying the first opposite surface of the substrate;
    a multifilament superconductor layer overlying the buffer layer;
    and at least one stabilizer layer, wherein
    a portion of said at least one stabilizer layer is adjacent to the superconducting layer, is striated and has a thickness of at least 5.0 microns.

2. The superconductor article of claim 1 wherein said multifilament superconductor layer comprises a high temperature superconductor material, having a critical temperature $T_c$ not less than about 77 K.

3. The superconductor article of claim 1 wherein said multifilament superconductor layer comprises $REBa_2Cu_3O_{7-x}$, wherein RE is a rare earth element.

4. The superconductor article of claim 1 wherein the multifilament superconducting layer is YBCO.

5. The superconductor article of claim 1 wherein the buffer layer comprises a biaxially crystal textured film having generally aligned crystals both in-plane and out-of-plane of the film.

6. The superconductor article of claim 1 wherein the substrate has a dimension ratio of not less than $10^3$.

7. The superconductor article of claim 1 further comprising a non-conductive insulator layer.

8. The superconductor article of claim 1 wherein the at least one stabilizer layer extends so as to define first and second side regions that encapsulate the multifilament superconductor layer.

9. The superconductor article of claim 8 wherein the at least one stabilizer layer additionally overlies the second opposite surface of the substrate so as to encapsulate the superconducting article.

10. The superconductor article of claim 8 wherein the at least one stabilizer layer comprises a first and second stabilizer layer, and wherein said first and second stabilizer layer comprises striated portions adjacent to the superconductor layer and non-striated portions adjacent to the second opposite surface of the substrate so as to encapsulate the superconducting article.

11. The superconductor article of claim 10 wherein the first stabilizer layer has a thickness within a range of about 0.1 microns to about 10.0 microns.

12. The superconductor article of claim 10 wherein the first stabilizer layer has a thickness within a range of about 1.5 microns to about 3.0 microns.

13. The superconductor article of claim 10 wherein the first stabilizer layer comprises a noble metal.

14. The superconductor article of claim 13, wherein the noble metal is Ag.

15. The superconductor article of claim 10, wherein the second stabilizer layer comprises a non-noble metal.

16. The superconductor article of claim 15, wherein the non-noble metal comprises a material from the group consisting of copper, aluminum, and alloys thereof 17. The superconductor article of claim 15 wherein the non-noble metal is copper.

18. The superconductor article of claim 15 wherein the second stabilizer layer is electroplated.

19. A dual-sided high temperature coated superconductor article, comprising:
    a substrate having first and second surfaces opposite each other;
    a first buffer layer adjacent to the first surface of the substrate;
    a second buffer layer adjacent to the second surface of the substrate;
    a first multifilament superconductor layer adjacent to the first buffer layer;
    a second multifilament superconductor layer adjacent to the second buffer layer; and
    at least one stabilizer layer adjacent to the first and second multifilament superconductor layer,
        wherein portions of the at least one stabilizer layer are striated and have a thickness of at least 5 microns,
        and wherein the at least one stabilizer layer further extends to define first and second side regions that encapsulate the superconducting article.

* * * * *